(12) United States Patent
Wu

(10) Patent No.: US 11,815,766 B2
(45) Date of Patent: Nov. 14, 2023

(54) ALIGNMENT FILM TRANSFER PRINTING PLATE AND MANUFACTURING METHOD THEREOF

(71) Applicant: Wuhan China Star Optoelectronics Technology Co., Ltd., Hubei (CN)

(72) Inventor: Yongbo Wu, Hubei (CN)

(73) Assignee: Wuhan China Star Optoelectronics Technology Co., Ltd., Hubei (CN)

( * ) Notice: Subject to any disclaimer, the term of this patent is extended or adjusted under 35 U.S.C. 154(b) by 794 days.

(21) Appl. No.: 15/733,071

(22) PCT Filed: Apr. 2, 2020

(86) PCT No.: PCT/CN2020/082951
§ 371 (c)(1),
(2) Date: May 7, 2020

(87) PCT Pub. No.: WO2021/159597
PCT Pub. Date: Aug. 19, 2021

(65) Prior Publication Data
US 2021/0311339 A1 Oct. 7, 2021

(30) Foreign Application Priority Data
Feb. 12, 2020 (CN) .......................... 202010088015.3

(51) Int. Cl.
*B41N 1/00* (2006.01)
*B41N 1/12* (2006.01)
(Continued)

(52) U.S. Cl.
CPC ............ *G02F 1/1337* (2013.01); *B29C 59/00* (2013.01); *B29C 59/026* (2013.01); *B30B 15/062* (2013.01); *B41N 1/00* (2013.01); *B41N 1/06* (2013.01); *B41N 1/12* (2013.01); *B44B 5/026* (2013.01); *G09F 9/301* (2013.01);
(Continued)

(58) Field of Classification Search
None
See application file for complete search history.

(56) References Cited

U.S. PATENT DOCUMENTS

| | | | |
|---|---|---|---|
| 11,385,504 B2 * | 7/2022 | Huang | ................ G02F 1/13378 |
| 2016/0291360 A1 | 10/2016 | Minowa | |
| 2022/0004062 A1 * | 1/2022 | Huang | ................ G02F 1/13378 |

FOREIGN PATENT DOCUMENTS

| | | |
|---|---|---|
| CN | 207764524 U | 8/2018 |
| CN | 108885376 A | 11/2018 |

(Continued)

*Primary Examiner* — Joshua D Zimmerman
(74) *Attorney, Agent, or Firm* — PV IP PC; Wei Te Chung; Zhigang Ma

(57) ABSTRACT

This application provides an alignment film transfer printing plate including a substrate, a first dot arranged on the substrate, and a plurality of second dots arranged around the first dot. A height of each of the second dots in a direction perpendicular to a surface of the substrate is less than or equal to a height of the first dot in the direction perpendicular to the surface of the substrate, a blocking portion is formed on an end of the first dot away from the substrate, and an area of an end surface of each of the second dots away from the substrate is less than an area of an end surface of the blocking portion away from the substrate.

14 Claims, 6 Drawing Sheets

(51) Int. Cl.
- *B29C 59/00* (2006.01)
- *B29C 59/02* (2006.01)
- *B30B 15/06* (2006.01)
- *G02F 1/1337* (2006.01)
- *H01L 27/12* (2006.01)
- *G09F 9/302* (2006.01)
- *G09F 9/30* (2006.01)
- *G09F 9/35* (2006.01)
- *B41N 1/06* (2006.01)
- *B44B 5/02* (2006.01)
- *H10K 50/852* (2023.01)
- *G09F 3/02* (2006.01)

(52) U.S. Cl.
CPC ............ *G09F 9/302* (2013.01); *G09F 9/35* (2013.01); *H01L 27/1218* (2013.01); *H01L 27/1262* (2013.01); *H10K 50/852* (2023.02); *C09K 2323/00* (2020.08); *C09K 2323/02* (2020.08); *C09K 2323/027* (2020.08); *G09F 2003/028* (2013.01); *G09F 2003/0211* (2013.01)

(56) References Cited

FOREIGN PATENT DOCUMENTS

| | | | | |
|---|---|---|---|---|
| CN | 109100882 A | | 12/2018 | |
| CN | 110068961 A | | 7/2019 | |
| CN | 110703505 A | * | 1/2020 | ......... G02F 1/13338 |
| CN | 110703505 A | | 1/2020 | |
| CN | 110109279 B | | 4/2021 | |
| JP | 2001343649 A | | 12/2001 | |

\* cited by examiner

ND MANUFACTURING METHOD
ALIGNMENT FILM TRANSFER PRINTING PLATE AND MANUFACTURING METHOD THEREOF

BACKGROUND OF INVENTION

Field of Invention

This application relates to the field of displays, and particularly relates to an alignment film transfer printing plate and a manufacturing method of the same.

Description of Prior Art

Blind-hole screens have been developed to fulfill full screen display. The so-called blind-hole screens refer to a technology in which openings are formed on a backlight layer of a liquid crystal display (LCD) device, and a camera is arranged under a protective cover plate and an LCD panel of the liquid crystal display device. In the blind-hole screens, as alignment films are formed at positions of the liquid crystal display panel corresponding to blind-holes, a low light transmittance is induced by the alignment films, affecting imaging effect of cameras, and making appearance of the blind-holes poorer.

In view of this, the present application aims to provide an alignment film transfer printing plate and a manufacturing method of the same, which could increase the light transmittance of the blind-holes and improve the appearance of the blind-holes.

SUMMARY OF INVENTION

This application provides an alignment film transfer printing plate configured to prevent an alignment film material from stacking in a blind-hole, wherein the alignment film transfer printing plate comprises a substrate, a first dot arranged on the substrate and a plurality of second dots arranged around the first dot, a height of each of the second dots in a direction perpendicular to a surface of the substrate is less than or equal to a height of the first dot in the direction perpendicular to the surface of the substrate, a blocking portion is formed on an end of the first dot away from the substrate, and an area of an end surface of each of the second dots away from the substrate is less than an area of an end surface of the blocking portion away from the substrate.

In one embodiment, an area of an end surface of the first dot close to the substrate is greater than the area of the end surface of the blocking portion away from the substrate.

In one embodiment, an area of an end surface of the first dot close to the substrate is less than or equal to the area of the end surface of the blocking portion away from the substrate.

In one embodiment, the first dot comprises a tapered portion connected to the blocking portion, and a cross-sectional area of the tapered portion gradually reduces along a direction of the substrate towards the blocking portion.

In one embodiment, the end surface of the blocking portion away from the substrate has a polygonal shape.

In one embodiment, the end surface of each of the second dots away from the substrate has a polygonal shape.

In one embodiment, materials of the first dot and the second dots are elastic photosensitive resin materials.

A manufacturing method of an alignment film transfer printing plate is also provided by this application, comprising steps of:

providing the alignment film transfer printing plate of claim 1, and coating the alignment film material on a surface of the alignment film transfer printing plate containing the first dot and the second dots;

providing an alignment substrate, and transfer printing the alignment film material to the alignment substrate using the alignment film transfer printing plate, wherein the blind-hole is provided on the alignment substrate, and the blocking portion is configured to prevent the alignment film material from entering the blind-hole; and curing the alignment film material to form an alignment film.

In one embodiment, the blocking portion is configured to embed into the blind-holes.

In one embodiment, the blocking portion is configured to cover the blind-holes.

Compared to prior art, in the alignment film transfer printing plate and the manufacturing method of same of this application, by configuring the blocking portion on a dot corresponding to the blind-holes of a liquid crystal display panel, when transfer printing the alignment film material to form the alignment film, the blocking portion is configured to block the alignment film material from entering the blind-holes. Stacking of the alignment film material in the blind-holes can be prevented, light transmittance of where the blind-holes locate can be increased, so as to achieve better light-sensing effect and improve appearance of products.

BRIEF DESCRIPTION OF DRAWINGS

In order to more clearly illustrate the technical solution of the present invention, a brief description of the drawings that are necessary for the illustration of the embodiments will be given as follows. Obviously, the drawings described below show only some embodiments of the present invention, and a person having ordinary skill in the art may also obtain other drawings based on the drawings described without making any creative effort.

DETAILED DESCRIPTION OF PREFERRED EMBODIMENTS

The present disclosure is further described in detail below with reference to the accompanying drawings and embodiments. Obviously, the following described embodiments are only part of the present disclosure but not all. A person having ordinary skill in the art may obtain other embodiments based on the embodiments provided in the present disclosure without making any creative effort, which all belong to the scope of the present disclosure.

Figure 1:
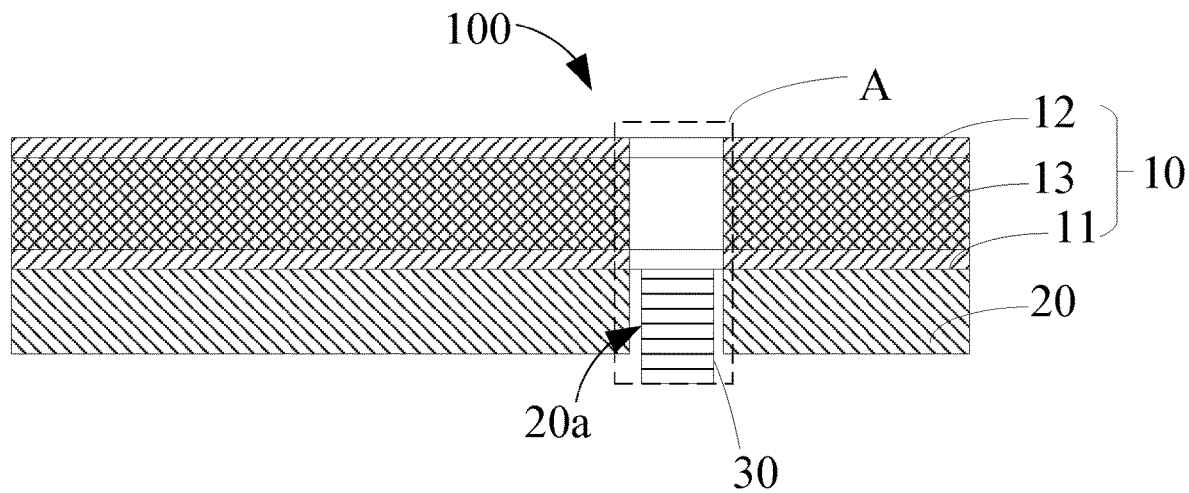
FIG. 1 is a cross-sectional view of manufacturing a liquid crystal display device using an alignment film transfer printing plate of this application.
Figure 2:
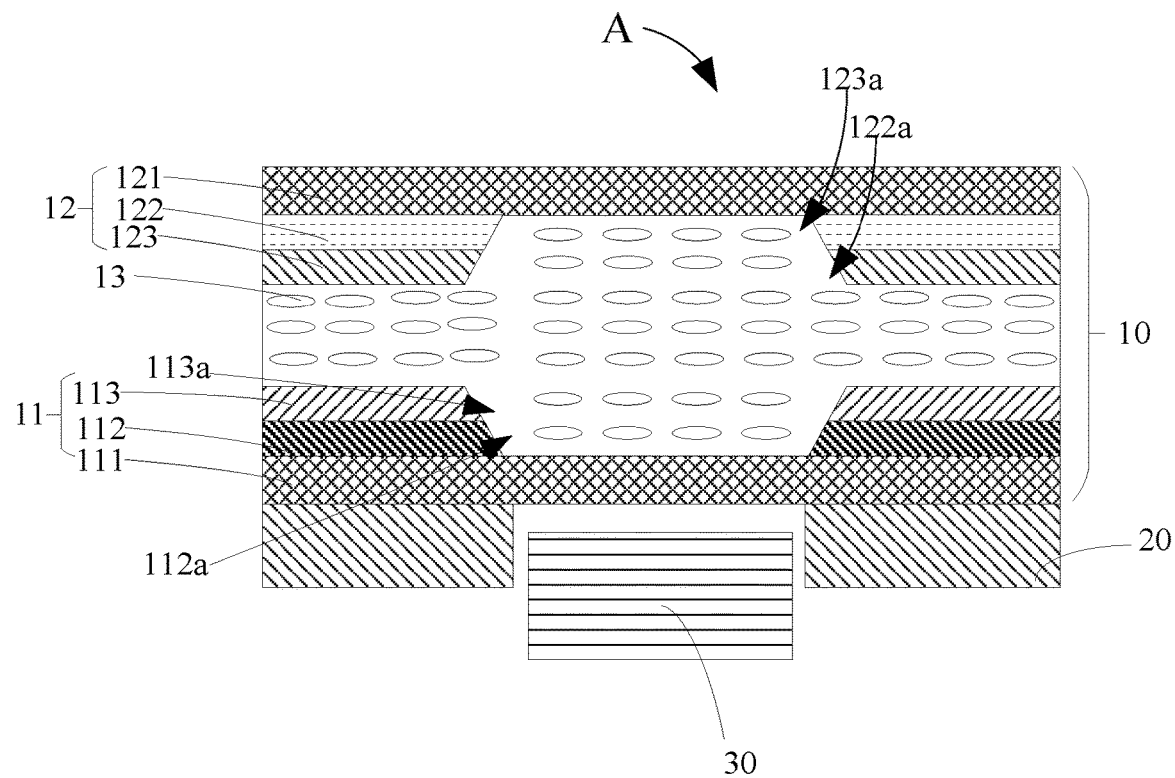
FIG. 2 is a drawing of partial enlargement of the liquid crystal display device of FIG. 1.
Figure 3:
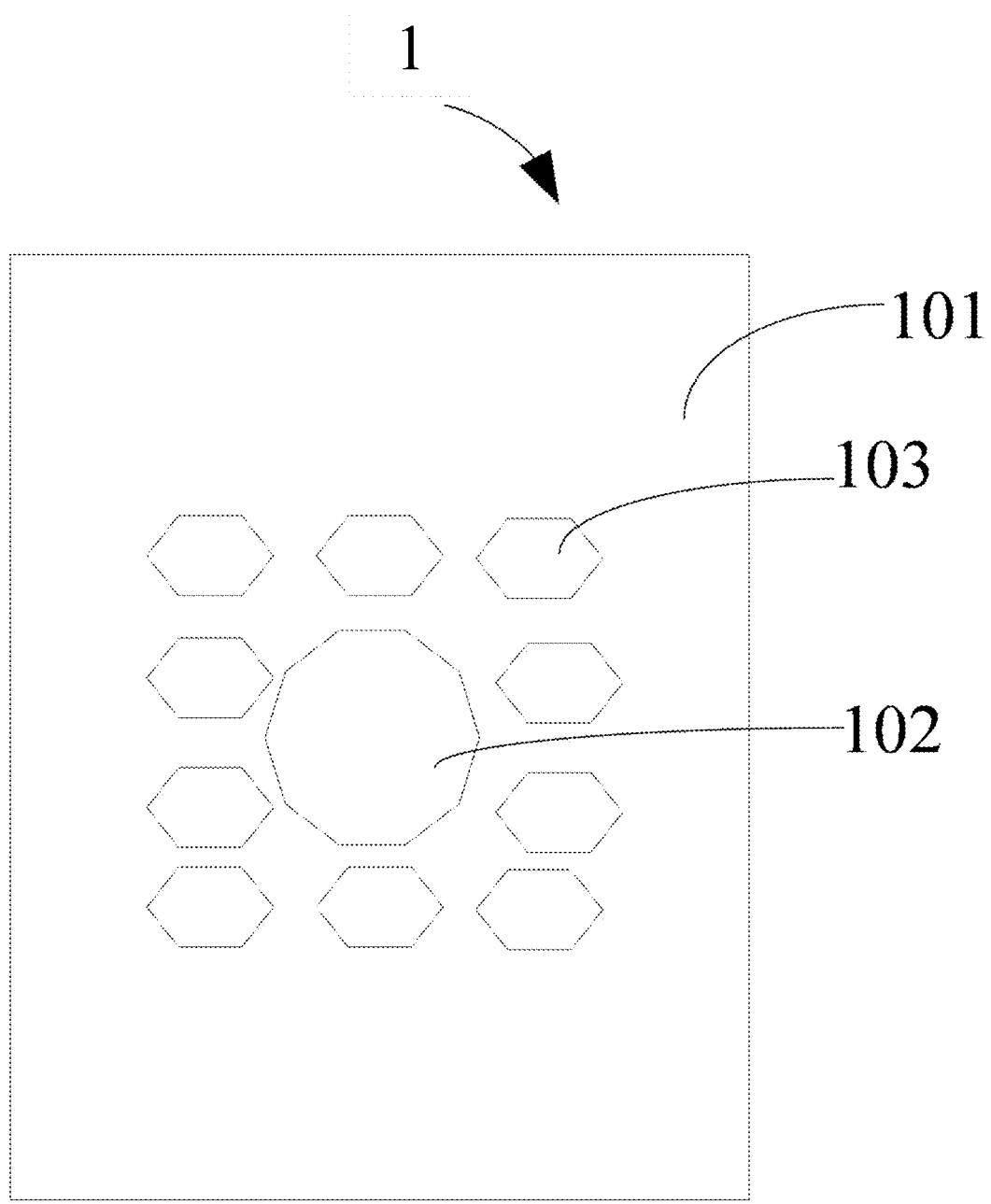
FIG. 3 is a schematic plan view of an alignment film transfer printing plate of a first embodiment of this application.
Figure 4:
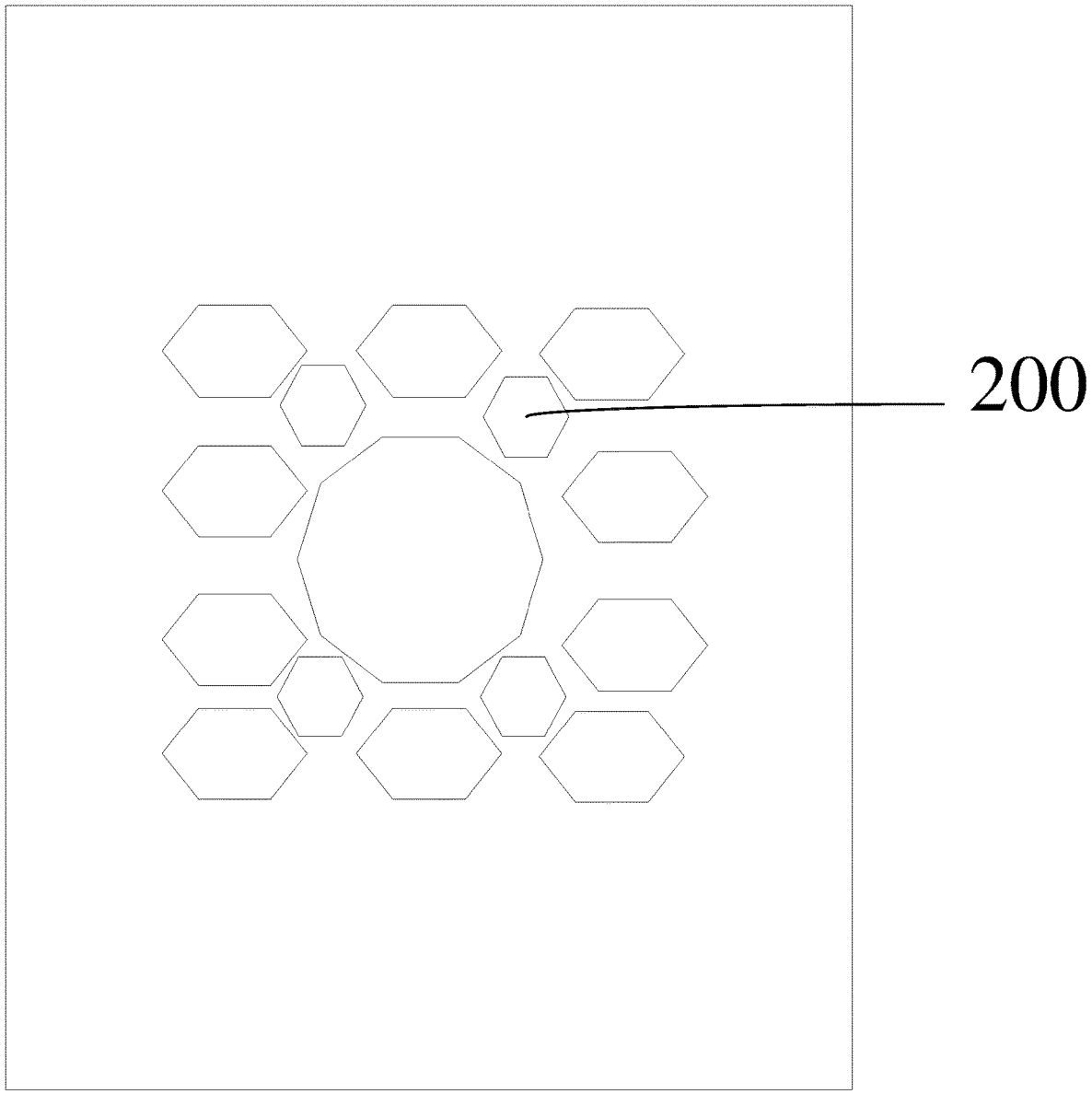
FIG. 4 is a schematic view of coating an alignment film material on the alignment film transfer printing plate of FIG. 3.

Please refer to FIG. 1 and FIG. 2, a liquid crystal display device 100 of a this application includes a liquid crystal display panel 10, a backlight module 20, and a light-sensitive component 30. The backlight module 20 is disposed on a side of the liquid crystal display panel 10. A receiving portion 20a is provided in the backlight module 20. The light-sensitive component 30 is received in the receiving portion 20a. The receiving portion 20a can be a through-hole provided in the backlight module 20. The light-sensitive component 30 includes but is not limited to a front-facing camera, a face recognition light-sensitive component, and a gesture sensor, etc.

The liquid crystal display device 100 further comprises a first polarizer (not shown in the figures) disposed between the display panel 10 and the backlight module 20, and a second polarizer (not shown in the figures) disposed on a side of the display panel 10 away from the backlight module 20. It can be understood that the liquid crystal display device 100 further includes other normal components of liquid crystal display devices, such as a cover glass, and a frame, etc.

The liquid crystal display panel 10 comprises a first substrate 11, a second substrate 12, and liquid crystal molecules 13 disposed between the first substrate 11 and the second substrate 12. The first substrate 11 includes a first base substrate 111, a first functional film layer 112 disposed on the first base substrate 111, and a first alignment film 113 disposed on the first functional film layer 112. A first opening 112a is provided in the first functional film layer 112. A second opening 113a is provided in the first alignment film 113. The first opening 112a is connected with the second opening 113a. For example, the first opening 112a is coaxially arranged with the second opening 113a. The first opening 112a and the second opening 113a correspond to the light-sensitive component 30 so as to allow light to enter the light-sensitive component 30. In one embodiment of this application, the first substrate 11 can be an array substrate. The first functional film layer 112 includes a thin film transistor layer. The first functional film layer 112 further comprises an insulating layer, a passivation layer, and a planarization layer. The first opening 112a is a through-hole penetrating the first functional film layer 112, and the first base substrate 111 is exposed from the first opening 112a. In other embodiment of this application, the first opening 112a can also be a blind-hole provided in the first functional film layer 112. For example, in one embodiment of this application, the thin film transistor layer comprises a light-shielding layer, a buffer layer, a semiconductor layer, a gate insulating layer, a gate electrode layer, an interlayer insulation layer, and a source/drain electrode layer, etc. The first opening 112a penetrates to the semiconductor layer, and the buffer layer is exposed from the first opening 112a.

The second substrate 12 includes a second base substrate 121, a second functional film layer 122 disposed on the second base substrate 121, and a second alignment film 123 disposed on the second functional film layer 122. A third opening 122a is provided in the second functional film layer 122. A fourth opening 123a is provided in the second alignment film 123. The third opening 122a is connected with the fourth opening 123a. For example, the third opening 122a is coaxially arranged with the fourth opening 123a. The third opening 122a and the fourth opening 123a correspond to the first opening 122a, the second opening 113a, and the light-sensitive component 30 so as to allow light to enter the light-sensitive component 30. In one embodiment of the present disclosure, the second substrate 12 can be a color filter substrate, and the second functional film layer 122 comprises a color filter layer and a black matrix. In one embodiment of the present disclosure, the third opening 122a penetrates the second functional film layer 122. The second base substrate 122 is exposed from the third opening 122a. In other embodiment of this application, the third opening 122a can also be a blind-hole provided in the second functional film layer 122.

Please refer to FIG. 1 to FIG. 4 at the same time, an alignment film transfer printing plate 1 of a second embodiment of this application can be configured to manufacture a blind-hole screen type liquid crystal display device 100 (as shown in FIG. 1 and FIG. 2). The alignment film transfer printing plate 1 is configured to prevent alignment films (such as the first alignment film 113 and the second alignment film 114) from stacking in the blind-holes (such as the first opening 112a and the third opening 122a). Hereby, the blind-holes refer to blind-holes for the liquid crystal display device 100.

Also known as relief plate, flexographic printing, or pillar covering, the alignment film transfer printing plate 1 comprises a substrate 101, a first dot 102 arranged on the substrate 101, and a plurality of second dots 103 arranged around the first dot 102. Materials of the first dot 102 and the second dots 103 can be elastic photosensitive resin materials. In one embodiment, the material of the first dot 102 and the second dots 103 can be ASAHI KASEI photosensitive resin (APR for short). That is to say, the alignment film transfer printing plate 1 can be an APR plate.

When transfer printing an alignment film material 200 to form an alignment film, the alignment film material 200 is distribute between the first dot 102 and the second dots 103. Each of the first dot 102 and the second dots 103 can be shaped into a pillar, such as a cylinder or a prism, etc. A height of each of the second dots 103 in a direction perpendicular to a surface of the substrate 101 is less than or equal to a height of the first dot 102 in the direction perpendicular to the surface of the substrate 101. The blocking portion 1021 is configured to prevent the alignment film material 200 from entering the blind-holes. An area of an end surface of each of the second dots 103 away from the substrate 101 is less than an area of an end surface of a blocking portion 1021 away from the substrate 101. The area of an end surface of each of the second dots 103 away from the substrate 101 is designed to be less than the area of an end surface of the blocking portion 1021 away from the substrate 101, so that the alignment film material 200 can be uniformly distributed on the first functional film layer 112 to form a uniform first alignment film 113. The blocking portion 1021 is formed on an end of the first dot 102 away from the substrate 101. An area of an end surface of the first dot 102 close to the substrate 101 is greater than the area of the end surface of the blocking portion 1021 away from the substrate 101.

The end surface of the blocking portion 1021 away from the substrate 101 could have a polygonal shape. The end surface of each of the second dots 103 away from the substrate 101 also could have a polygonal shape. Compared to a circular end surface, the polygonal end surface will be more helpful for the alignment film material to diffuse along sides of the polygon so as to distribute uniformly.

The first substrate 11 is taken as example as below to illustrate a structure and use of the alignment film transfer printing plate 1. It can be understood that the alignment film transfer printing plate 1 can also be configured to form the alignment film 123 of the second substrate 12.

Figure 5A:
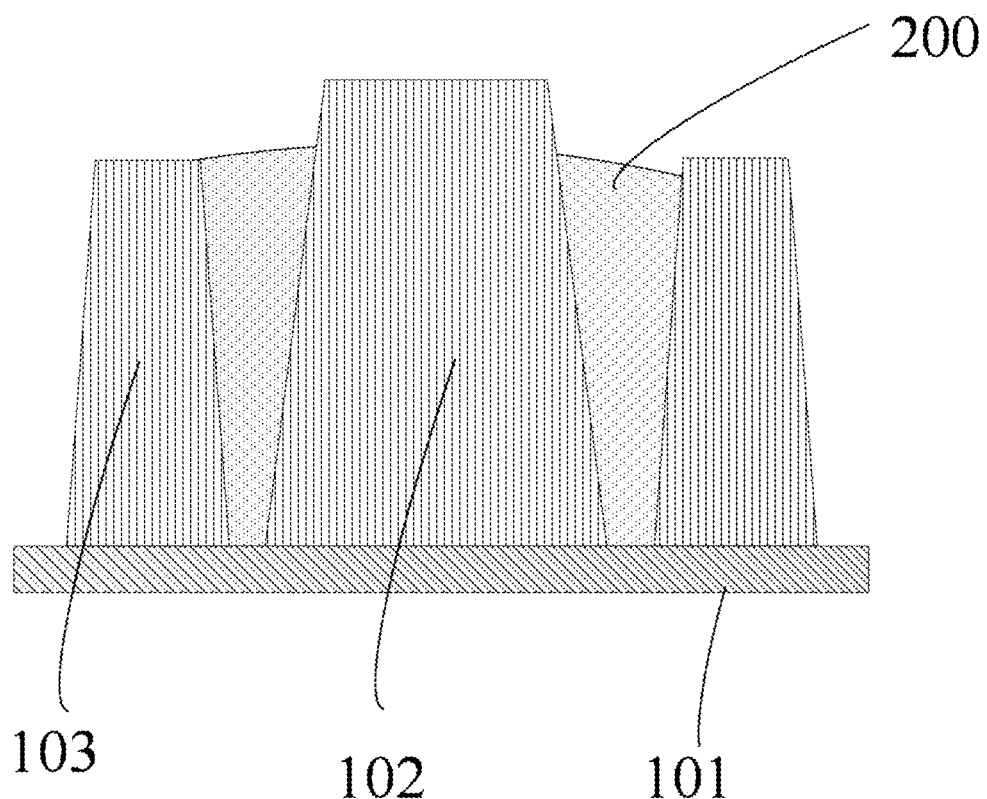
FIG. 5(a) to FIG. 5(c) are flow charts of a manufacturing method of an alignment film according to a second embodiment of this application.
Figure 5B:
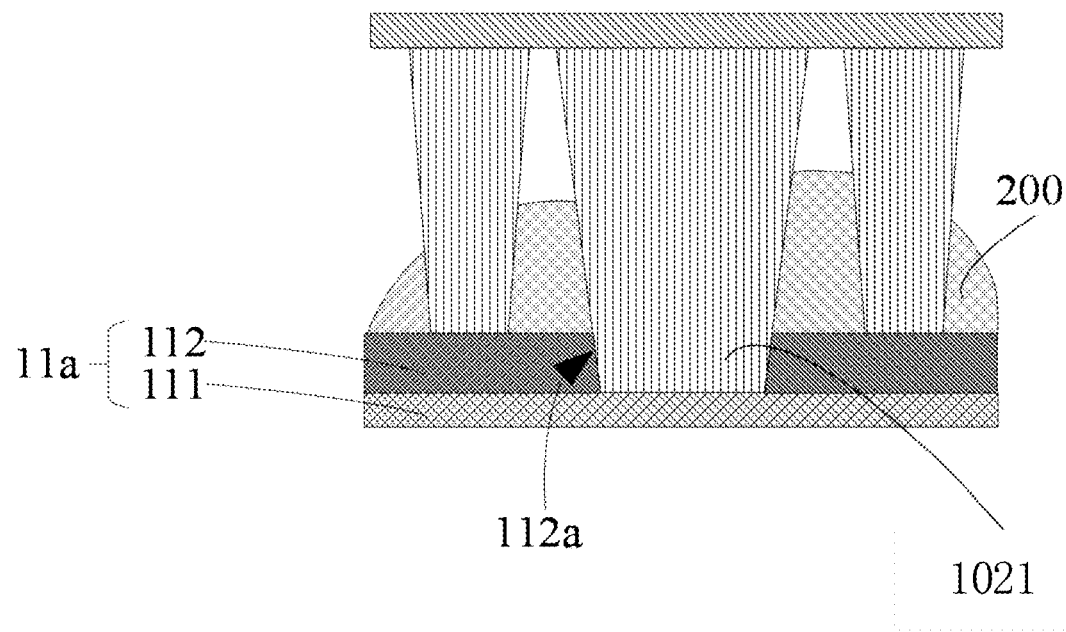
Figure 5C:
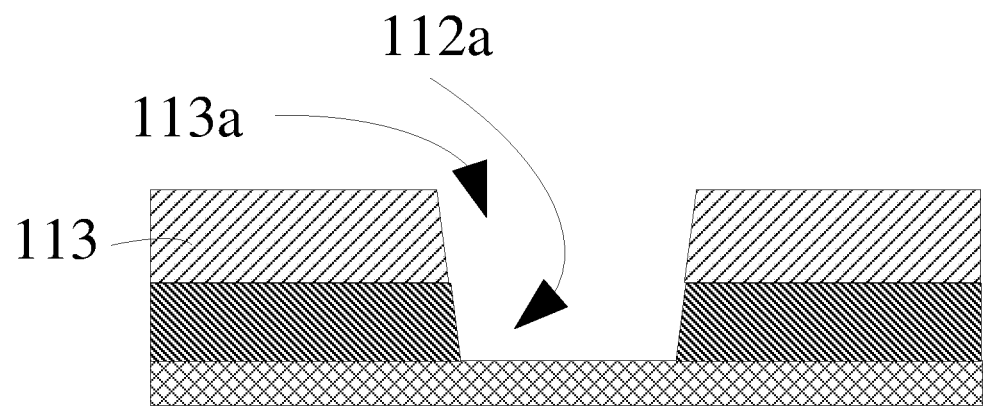

Please refer to FIG. 5(a) to FIG. 5(c), in one embodiment of this application, the blocking portion 1021 can be configured to embed into the first opening 112a when transfer printing the alignment film material 200 to form the first alignment film 113, so that the alignment film material 200 will not enter the first opening 112a when transfer printing the alignment film material 200. After the transfer printing is completed, a second opening 113a connected with the first opening 112a is formed in the first alignment film 113.

The blocking portion 1021 is configured to a corresponding shape to the first opening 112a of the first substrate 11. The so-called corresponding shape can be a same shape or an almost same shape. For example, under the circumstance that the first opening 112a is configured as a cylindrical through hole, the blocking portion 1021 is also configured as a cylinder which is a circle in top view and matches the first opening 112a. The area of the blocking portion 1021 is equal to or slightly less than that of the first opening 112a. That is to say, a diameter of the blocking portion 1021 is equal to or slightly less than that of the first opening 112a. As a material of the APR plate includes an elastic resin, the blocking portion 1021 will slightly expand and deform under a downward pressure during transfer printing. Under the circumstance that the diameter of the blocking portion 1021 is equal to or less than that of the first opening 112a, when performing the transfer printing of the alignment film material, the blocking portion 1021 can closely fit the first opening 112a. In other embodiments of this application, under the circumstance that the first opening 112a is an opening which is circular in top view, the blocking portion 1021 is configured as a polygon in top view, such as a hexagon, an octagon, or a decagon. And a distance from a center to an end point of the polygon is equal to or slightly less than the diameter of the first opening 112a. Similarly, when performing the transfer printing of the alignment film material, the blocking portion 1021 will slightly expand and deform under a downward pressure during transfer printing and then closely fit the first opening 112a.

Figure 6A:
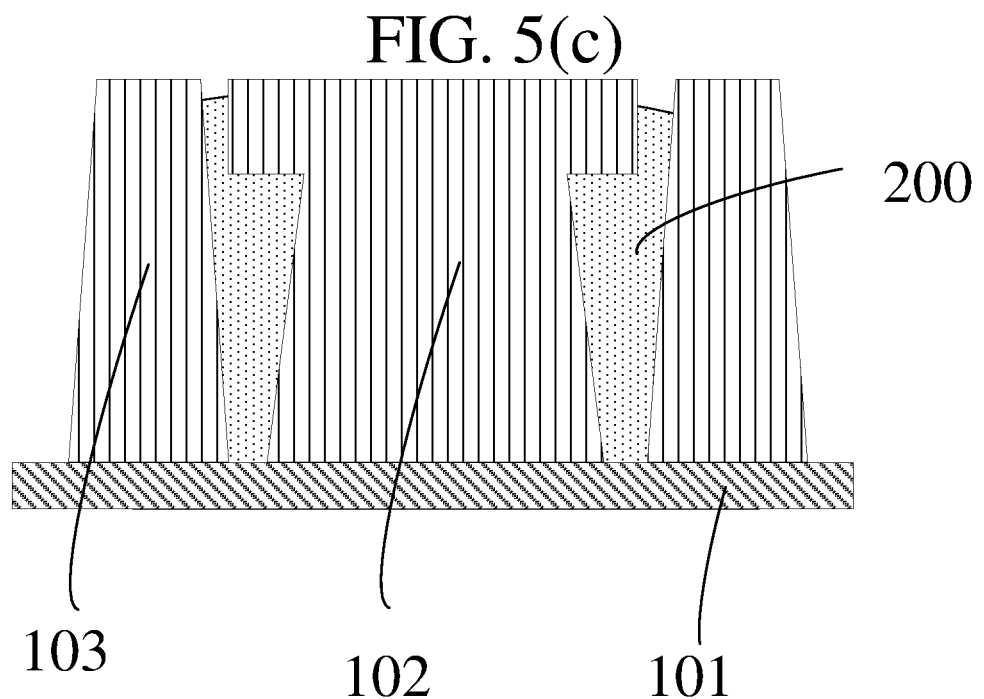
FIG. 6(a) to FIG. 6(c) are flow charts of a manufacturing method of an alignment film according to another embodiment of this application.
Figure 6:
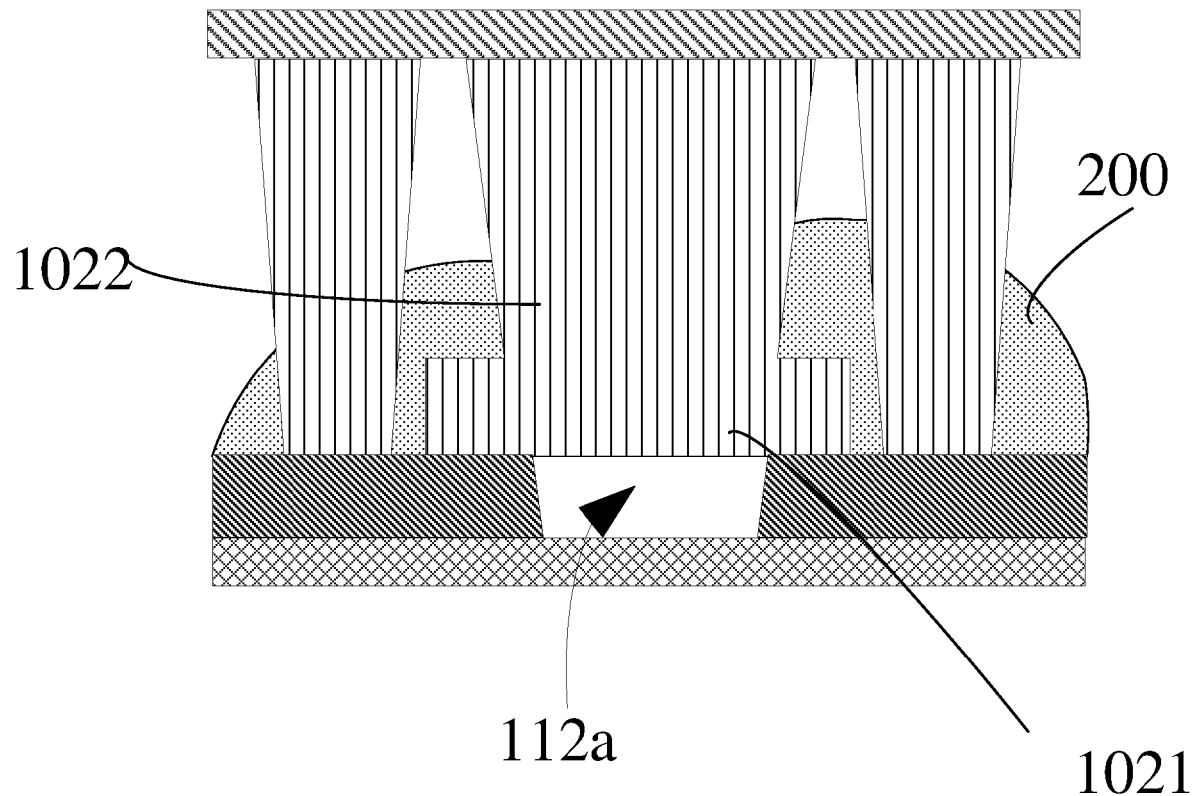
Figure 6:
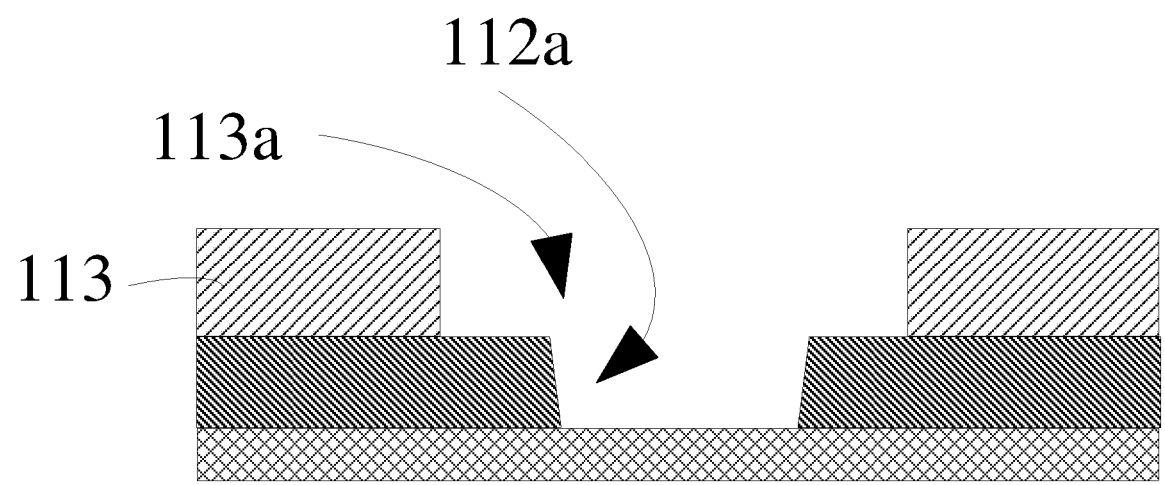

Please refer to FIG. 6(a) to FIG. 6(c), in another embodiment of the application, the blocking portion 1021 can be configured to locate over the first opening 112a and cover the first opening 112a when transfer printing the alignment film material 200 to form the alignment film 113, so that the alignment film material 200 will not enter the first opening 112a when transfer printing the alignment film material 200. After the transfer printing is completed, a second opening 113a connected with the first opening 112a is formed in the first alignment film 113.

A height of each of the second dots 103 in a direction perpendicular to a surface of the substrate 101 is less than or equal to a height of the first dot 102 in the direction perpendicular to the surface of the substrate 101. An area of an end surface of each of the second dots 103 away from the substrate 101 is less than an area of an end surface of the blocking portion 1021 away from the substrate 101. An area of an end surface of the first dot 103 close to the substrate 101 is less than or equal to the area of the end surface of the blocking portion 1021 away from the substrate 101. Besides, the first dot 102 further comprises a tapered portion 1022 connected with the blocking portion 1021. A cross-sectional area of the tapered portion 1022 gradually reduces along a direction of the substrate 101 towards the blocking portion 1021. The end surface of the blocking portion 1021 away from the substrate 101 could have a polygonal shape. The end surface of each of the second dots 103 away from the substrate 101 also could have a polygonal shape.

In this embodiment, the shapes of the blocking portion 1021 and the first opening 112a are not limited, as long as the blocking portion 1021 can totally cover the first opening 112a when performing the transfer printing. For example, under the circumstance that the first opening 112a is an opening which is circular in top view, the blocking portion 1021 is configured to be circular in top view. The area of the blocking portion 1021 is greater than that of the first opening 112a. That is to say, a diameter of the blocking portion 1021 is greater than that of the first opening 112a.

A manufacturing method of an alignment film is provided by embodiment of this application, using the above-mentioned alignment film transfer printing plate. The manufacturing method of the alignment film transfer printing plate comprises the steps of:

S1: Please refer to FIG. 5(a), providing an alignment film transfer printing plate 1, and coating an alignment film material 200 on a surface of the alignment film transfer printing plate 1 with the first dot 102 and the second dots 103 thereon.

For example, the alignment film material 200 can be a polymer material, and the polymer material can be polyimide. As illustrated in above embodiments, the alignment film transfer printing plate 1 is configured to prevent an alignment film from stacking in blind-holes, and the alignment film transfer printing plate 1 includes a substrate 101 and the first dot 102 arranged on the substrate 101, and a blocking portion 1021 is formed on an end of the first dot 102 away from the substrate 101.

S2: Please refer to FIG. 5(b), providing an alignment substrate 11a, and transfer printing the alignment film material 200 to the alignment substrate 11a using the alignment film transfer printing plate 1, wherein a blind-hole is provided on the alignment substrate 11a. The blocking portion 1021 is configured to prevent the alignment film material 200 from entering the blind-hole.

Herein, a first substrate 11 is yet taken as example to illustrate a structure and usage of the alignment film transfer printing plate 1. The first substrate 11 includes a first base substrate 111 and a first functional film layer 112 disposed on the first base substrate 111. A first opening 112a is provided in the first functional film layer 112. The first opening 112a means the blind-hole. When transfer printing the alignment film material 200 to the alignment substrate 11a, the alignment film material 200 located between the dots is squeezed to the alignment substrate 11a and distributes on the alignment substrate 11a to form a uniform film layer. Due to the existence of the blocking portion 1021, the alignment film material 200 cannot enter the first opening 112a. After removing the alignment film transfer printing plate 1, a second opening 113a is formed in a first alignment film 113. The first opening 112a is connected with the second opening 113a. In one embodiment, an area of an end surface of each of the second dots 103 away from the substrate 101 is designed to be less than the area of an end surface of the blocking portion 1021 away from the substrate 101, so that the alignment film material 200 can be uniformly distributed on the first functional film layer 12 to form a uniform first alignment film 113. The end surface of the blocking portion 1021 away from the substrate 101 could have a polygonal shape. The end surface of each of the second dots 103 away from the substrate 101 is also configured to have a polygonal shape. Compared to a circular end surface, the polygonal end surface will be more helpful for the alignment film material to diffuse along sides of the polygon so as to distribute uniformly.

It can be understood that the alignment substrate 11a could be a color filter substrate or an array substrate. In another embodiment, a structure of the alignment film transfer printing plate 1 can be the one illustrated in FIG. 6(a). Herein description is omitted. The blocking portion 1021 is configured to cover the blind-hole.

S3: Removing the alignment film transfer printing plate 1 and curing the alignment film material 200 to form the alignment film. For example, methods to cure the alignment film material 200 is thermal curing or ultraviolet curing.

In the alignment film transfer printing plate and the manufacturing method of the same of this application, by configuring the blocking portion on a dot corresponding to the blind-holes of a liquid crystal display panel, when transfer printing the alignment film material to form the alignment film, the blocking portion is configured to block the alignment film material from entering the blind-holes. Stacking of the alignment film material in the blind-holes can be prevented, and light transmittance of where the blind-holes locate can be increased, so as to achieve better light-sensing effect and improve appearance of products.

The above description provides a detailed introduction to the application. In this disclosure, specific examples are applied to explain principle and embodiments of the application. The description of the above embodiments is only configured to help understand the application. At the same time, for those skilled in the art, according to the thought of the present disclosure, there will be changes in the specific embodiments and application scope. In conclusion, the content of the specification should not be understood as the limitation of the application.

What is claimed is:

1. An alignment film transfer printing plate configured to prevent an alignment film material from stacking in a blind-hole, wherein the alignment film transfer printing plate comprises a substrate, a first dot arranged on the substrate, and a plurality of second dots arranged around the first dot, a height of each of the second dots in a direction perpendicular to a surface of the substrate is less than or equal to a height of the first dot in the direction perpendicular to the surface of the substrate, a blocking portion is formed on an end of the first dot away from the substrate, and an area of an end surface of each of the second dots away from the substrate is less than an area of an end surface of the blocking portion away from the substrate, wherein an area of an end surface of the first dot close to the substrate is less than or equal to the area of the end surface of the blocking portion away from the substrate.

2. The alignment film transfer printing plate of claim 1, wherein the first dot comprises a tapered portion connected to the blocking portion, and a cross-sectional area of the tapered portion gradually reduces along a direction of the substrate towards the blocking portion.

3. The alignment film transfer printing plate of claim 1, wherein the end surface of the blocking portion away from the substrate has a polygonal shape.

4. The alignment film transfer printing plate of claim 1, wherein the end surface of each of the second dots away from the substrate has a polygonal shape.

5. The alignment film transfer printing plate of claim 3, wherein materials of the first dot and the second dots are elastic photosensitive resin materials.

6. The alignment film transfer printing plate of claim 4, wherein materials of the first dot and the second dots are elastic photosensitive resin materials.

7. A manufacturing method of an alignment film transfer printing plate, comprising steps of:
    providing the alignment film transfer printing plate of claim 1, and coating the alignment film material on a surface of the alignment film transfer printing plate containing the first dot and the second dots;
    providing an alignment substrate, and transfer printing the alignment film material to the alignment substrate using the alignment film transfer printing plate, wherein the blind-hole is provided on the alignment substrate, and the blocking portion is configured to prevent the alignment film material from entering the blind-hole; and
    curing the alignment film material to form an alignment film;
    wherein an area of an end surface of the first dot close to the substrate is less than or equal to the area of the end surface of the blocking portion away from the substrate.

8. The manufacturing method of the alignment film transfer printing plate of claim 7, wherein the first dot comprises a tapered portion connected to the blocking portion, and a cross-sectional area of the tapered portion gradually reduces along a direction of the substrate towards the blocking portion.

9. The manufacturing method of the alignment film transfer printing plate of claim 7, wherein the end surface of the blocking portion away from the substrate has a polygonal shape.

10. The manufacturing method of the alignment film transfer printing plate of claim 7, wherein the end surface of each of the second dots away from the substrate has a polygonal shape.

11. The manufacturing method of the alignment film transfer printing plate of claim 8, wherein materials of the first dot and the second dots are elastic photosensitive resin materials.

12. The manufacturing method of the alignment film transfer printing plate of claim 9, wherein materials of the first dot and the second dots are elastic photosensitive resin materials.

13. The manufacturing method of the alignment film transfer printing plate of claim 7, wherein an area of an end surface of the first dot close to the substrate is greater than the area of the end surface of the blocking portion away from the substrate, the blocking portion is configured to embed into the blind-hole.

14. The manufacturing method of the alignment film transfer printing plate of claim 7, wherein an area of an end surface of the first dot close to the substrate is less than or equal to the area of the end surface of the blocking portion away from the substrate, the blocking portion is configured to cover the blind-hole.

* * * * *